United States Patent
Sekine

(10) Patent No.: US 10,157,945 B2
(45) Date of Patent: Dec. 18, 2018

(54) SOLID-STATE IMAGING DEVICE AND METHOD FOR MANUFACTURING THE SAME

(71) Applicant: SETECH CO., LTD., Kanagawa (JP)

(72) Inventor: Hirokazu Sekine, Kanagawa (JP)

(73) Assignee: SETECH CO., LTD., Kanagawa (JP)

( * ) Notice: Subject to any disclaimer, the term of this patent is extended or adjusted under 35 U.S.C. 154(b) by 33 days.

(21) Appl. No.: 15/326,732

(22) PCT Filed: Jul. 12, 2015

(86) PCT No.: PCT/JP2015/069971
§ 371 (c)(1),
(2) Date: Jun. 19, 2017

(87) PCT Pub. No.: WO2016/009972
PCT Pub. Date: Jan. 21, 2016

(65) Prior Publication Data
US 2017/0301713 A1 Oct. 19, 2017

(30) Foreign Application Priority Data
Jul. 17, 2014 (JP) .................. 2014-147243

(51) Int. Cl.
*H01L 27/146* (2006.01)
*H01L 23/12* (2006.01)
(Continued)

(52) U.S. Cl.
CPC ........ *H01L 27/14623* (2013.01); *H01L 23/12* (2013.01); *H01L 27/14* (2013.01);
(Continued)

(58) Field of Classification Search
CPC ......... H01L 27/14623; H01L 27/14618; H01L 27/14632; H01L 27/14643;
(Continued)

(56) References Cited

U.S. PATENT DOCUMENTS 5,517,017 A * 5/1996 Yamada ............ H01L 27/14643
126/573
5,693,967 A * 12/1997 Park .................. H01L 27/14627
257/223
(Continued)

FOREIGN PATENT DOCUMENTS

JP H6-77526 * 3/1994 ............ H01L 31/16
JP H09-236740 A 9/1997
(Continued)

OTHER PUBLICATIONS

Machine translation, Niiobi, Japanese Pat. Pub. No. JP H6-77526, translation date: Apr. 11, 2018, Espacenet, all pages.*
(Continued)

*Primary Examiner* — Victoria K Hall
(74) *Attorney, Agent, or Firm* — Maier & Maier, PLLC

(57) ABSTRACT

A solid state imaging device for a wafer-level pinhole camera module is provided by using a mask transfer technique to form, with a high degree of precision, pinhole openings in a light-shielding material formed upon cover glass covering the surfaces of imaging elements for wafer-level camera modules, and then dicing. Also provided is a manufacturing method therefor. Further provided is a compound-eye camera system in which a plurality of pinhole openings are formed. It is also possible to impart an apodization effect by changing the cross-sectional shape of the opening in the light-shielding material to a tapered shape to thereby change the transmission characteristics thereof.

5 Claims, 4 Drawing Sheets

(51) Int. Cl.
*H01L 27/14* (2006.01)
*H04N 5/369* (2011.01)

(52) U.S. Cl.
CPC .. *H01L 27/14618* (2013.01); *H01L 27/14632* (2013.01); *H01L 27/14643* (2013.01); *H01L 27/14685* (2013.01); *H01L 27/14687* (2013.01); *H04N 5/369* (2013.01); *H01L 2224/94* (2013.01); *H01L 2924/16195* (2013.01)

(58) Field of Classification Search
CPC ......... H01L 27/14685; H01L 27/14687; H01L 27/14625; H01L 27/14627; H01L 31/02164; H01L 31/02366; H01L 31/0232; H01L 31/02325; H01L 31/02327
USPC ............................... 257/98, E21.123, E31.13
See application file for complete search history.

(56) References Cited

U.S. PATENT DOCUMENTS

| | | | | |
|---|---|---|---|---|
| 6,534,798 | B1* | 3/2003 | Scherer | H01L 33/465 257/98 |
| 6,611,003 | B1* | 8/2003 | Hatakoshi | H01L 33/20 257/98 |
| 2002/0044215 | A1 | 4/2002 | Takagi et al. | |
| 2003/0209722 | A1* | 11/2003 | Hatakoshi | H01L 33/20 257/98 |
| 2004/0077121 | A1 | 4/2004 | Maeda et al. | |
| 2004/0094695 | A1* | 5/2004 | Chen | H01L 27/14618 250/216 |
| 2004/0113048 | A1* | 6/2004 | Tu | H01L 27/14618 250/208.1 |
| 2004/0149884 | A1* | 8/2004 | Shiau | H01L 27/14618 250/208.1 |
| 2005/0270403 | A1* | 12/2005 | Adachi | H01L 27/14618 348/340 |
| 2005/0275750 | A1* | 12/2005 | Akram | H01L 27/14634 348/374 |
| 2006/0186499 | A1 | 8/2006 | Maeda et al. | |
| 2006/0226452 | A1* | 10/2006 | Yamaguchi | G02B 5/005 257/231 |
| 2006/0252174 | A1 | 11/2006 | Maeda et al. | |
| 2006/0252175 | A1 | 11/2006 | Maeda et al. | |
| 2006/0284215 | A1 | 12/2006 | Maeda et al. | |
| 2008/0179503 | A1* | 7/2008 | Camargo | H01L 31/0203 250/216 |
| 2008/0239120 | A1 | 10/2008 | Hsuan et al. | |
| 2009/0008683 | A1* | 1/2009 | Nishizawa | H01L 27/14618 257/292 |
| 2010/0052192 | A1* | 3/2010 | Hasegawa | H01L 23/552 257/797 |
| 2010/0073534 | A1* | 3/2010 | Yano | B29D 11/00432 348/294 |
| 2010/0117176 | A1* | 5/2010 | Uekawa | H01L 27/14618 257/432 |
| 2011/0026141 | A1 | 2/2011 | Barrows | |
| 2011/0204209 | A1* | 8/2011 | Barrows | G02B 27/58 250/208.1 |
| 2012/0008934 | A1 | 1/2012 | Kawasaki | |
| 2012/0133915 | A1* | 5/2012 | Matsuyama | G03F 7/70116 355/67 |
| 2012/0187281 | A1* | 7/2012 | Kerness | H01L 27/14618 250/214.1 |
| 2013/0087873 | A1 | 4/2013 | Sekine | |
| 2013/0165312 | A1* | 6/2013 | Komai | C03C 1/00 501/66 |
| 2014/0264702 | A1* | 9/2014 | Souchkov | H01L 27/1446 257/435 |
| 2015/0318326 | A1* | 11/2015 | Martin | H01L 27/14698 438/65 |
| 2016/0211388 | A1* | 7/2016 | Natsuaki | H01L 27/1462 |

FOREIGN PATENT DOCUMENTS

| | | |
|---|---|---|
| JP | H10-065132 A | 3/1998 |
| JP | 2004-063751 A | 2/2004 |
| JP | 2007-158751 A | 6/2007 |
| JP | 2007-300164 A | 11/2007 |
| JP | 2008-124538 A | 5/2008 |
| JP | 2010-056170 A | 3/2010 |
| JP | 2010-093200 A | 4/2010 |
| JP | 2011-100903 A | 5/2011 |
| JP | 2012-018993 A | 1/2012 |
| JP | 2013-084722 A | 5/2013 |

OTHER PUBLICATIONS

International Search Report dated Nov. 24, 2015 in corresponding Application No. PCT/JP2015/069971; 2 pgs.
Office Action dated May 11, 2015 in corresponding JP Application No. 2014-147243; 9 pgs.
Extended European Search Report dated May 23, 2018 in corresponding European Application No. 15821720.8; 6 pgs.

\* cited by examiner

[FIG. 1(A)]
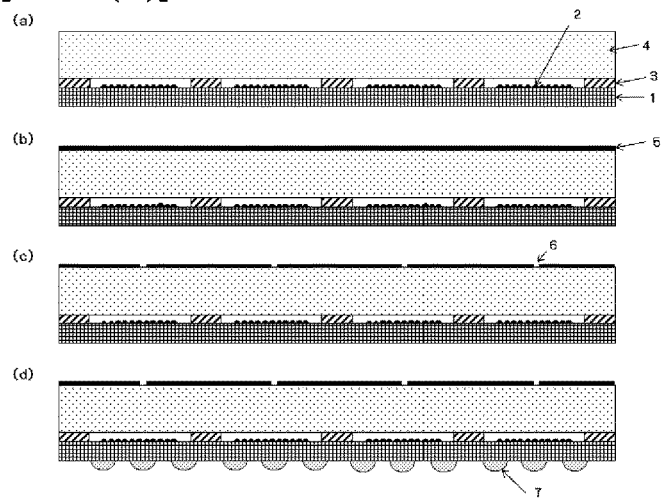
[FIG. 1(B)]
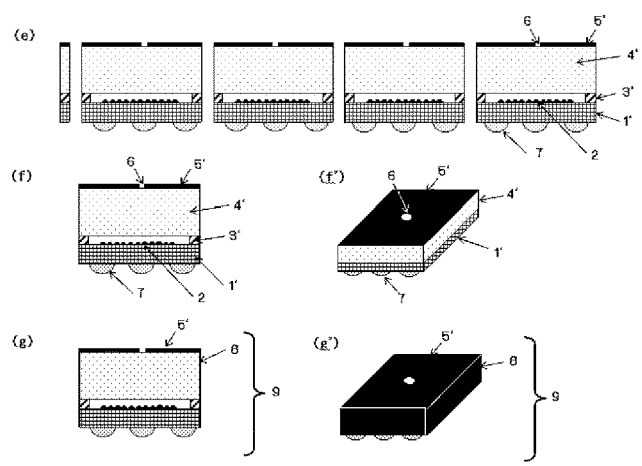
[FIG. 2(A)]
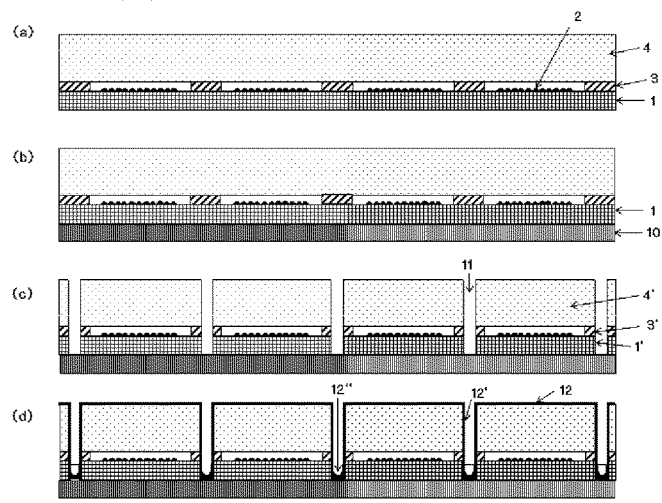

[FIG. 2(B)]
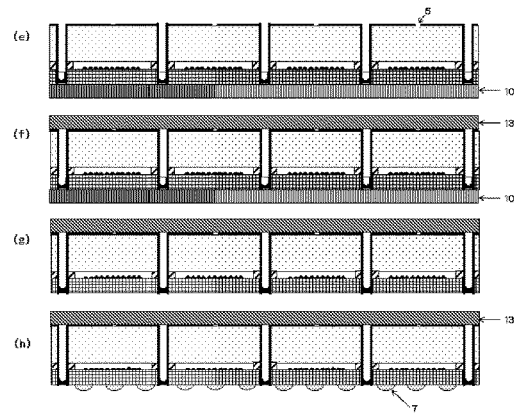
[FIG. 2(C)]
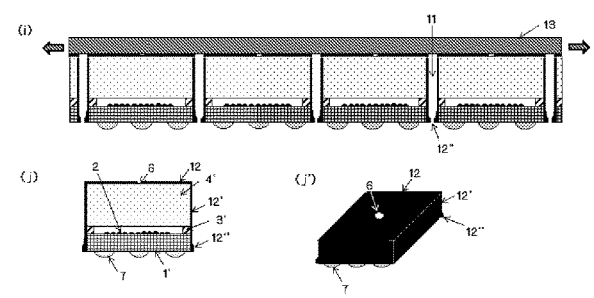
[FIG. 3]
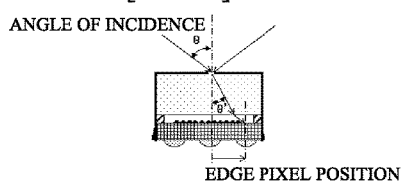
EDGE PIXEL POSITION
[FIG. 4]
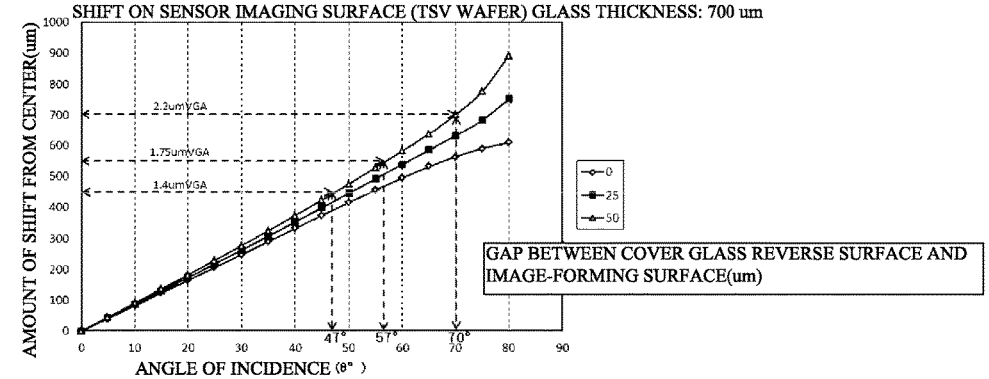

[FIG. 5]
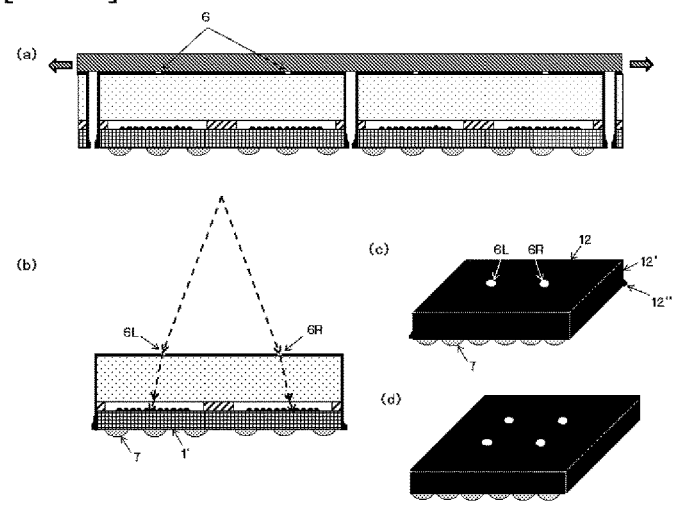
[FIG. 6]
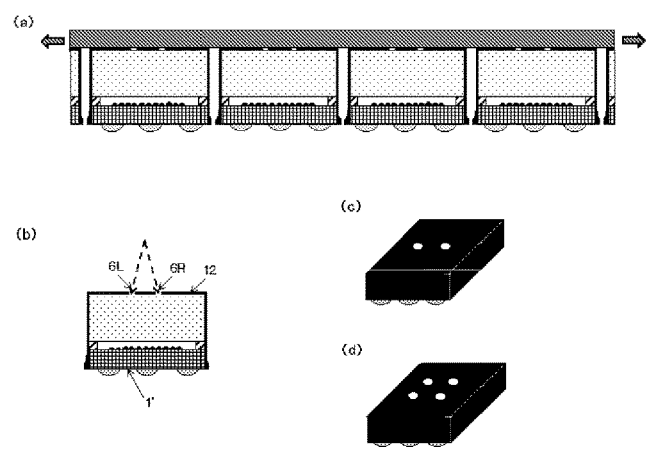
[FIG. 7]
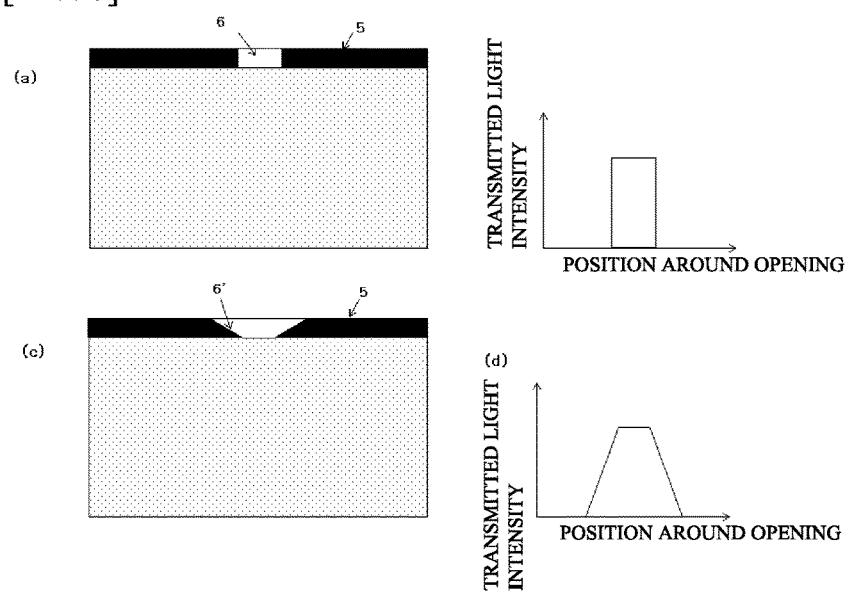

[FIG. 8]
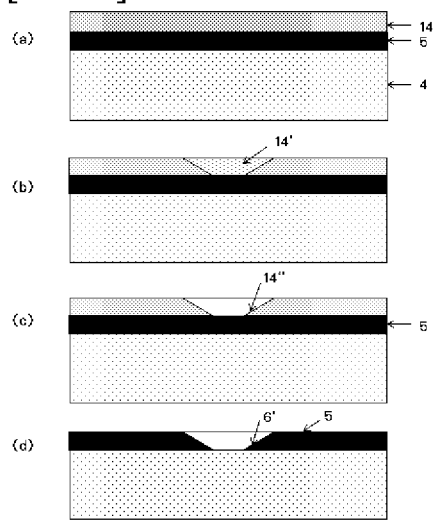
[FIG. 9]
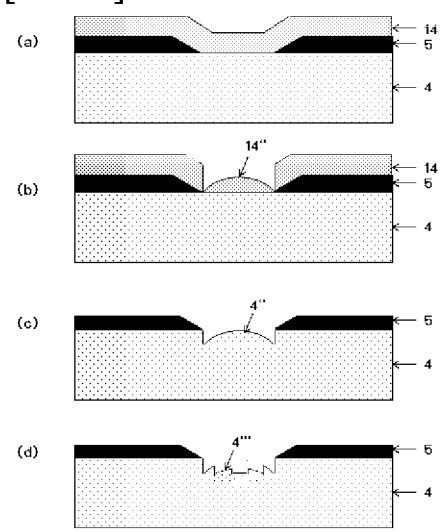

SOLID-STATE IMAGING DEVICE AND METHOD FOR MANUFACTURING THE SAME

TECHNICAL FIELD

The present invention relates to a solid-state imaging device and a method for manufacturing the same, and relates to a camera module of a chip-size-package type, of which the optical system for obtaining an image is manufactured on the wafer level.

BACKGROUND ART

In order to address the aging of the population composition and the demand for social security and safety, there is a quickly increasing demand for camera modules aiming at applications such as monitor cameras, surveillance cameras and home monitoring cameras. For these camera modules, there is an increasing demand for lowering the price for reducing the system cost and for reducing the size in order to enhance the degree of freedom for mounting cameras.

Patent Document No. 1 discloses a camera module that addresses the demand for reducing the size. Specifically, as a measure for reducing the size, it has been proposed to form a wafer-level camera module including a lens and an imaging element chip integral with each other, thereby reducing the size of the camera module.

In order to address the demand for low cost, wafer-level camera modules of Patent Document No. 2 are obtained by severing, into individual camera modules, a structure including a lens wafer and an imaging element wafer bonded together via a bonding section.

Camera modules using no lens are known as pinhole cameras. According to Patent Document No. 3, an imaging element is provided on the bottom portion of a hollow package casing, and a protection plate is formed on top of the casing, wherein a pinhole is formed from a transparent material in the central portion of the protection plate, and the protection plate other than the pinhole is formed by a light-blocking material. The disclosure states that the viewing angle is defined by changing the distance from the pinhole to the sensor.

Patent Document No. 4 shows a method in which a projection of a cover casing having a pinhole formed therein is pressed against the end portion of an imaging element chip so that the pinhole is positioned at the center of the photosensitive area of the imaging element.

Typically, when the opening edge of the lens system is sharp, the resultant image will be unnatural for high frequency components, referred to as false resolution, due to the influence of optical interference. In order to prevent this, there is an approach known in the art for improving false resolution, which uses a filter, called an apodization filter, configured so that the amount of light to be transmitted therethrough decreases gradually away from the optical axis in the direction perpendicular to the optical axis.

The apodization filter is preferably a flat plate filter that is not powerful, taking into consideration the ease of handling, the degree of freedom in optical design, the influence on the performance of the overall optical system, etc. This is why the configuration of Patent Document No. 5 is obtained by attaching together a plano-concave lens made of an ND (neutral density) glass and a plano-convex lens made of a glass that has the same refractive index as the ND glass. The provision of an apodization filter as described above requires improvements in the filter processing precision, the assembly precision, and the refractive index precision, thus substantially increasing the difficulty.

CITATION LIST

Patent Literature

Patent Document No. 1: Japanese Laid-Open Patent Publication No. 2004-63751
Patent Document No. 2: Japanese Laid-Open Patent Publication No. 2010-93200
Patent Document No. 3: Japanese Laid-Open Patent Publication No. 2007-300164
Patent Document No. 4: Japanese Laid-Open Patent Publication No. 2008-124538
Patent Document No. 5: Japanese Laid-Open Patent Publication No. 9-236740

SUMMARY OF INVENTION

Technical Problem

With camera modules of Patent Document Nos. 1 and 2, individual camera modules are formed only by bonding together a lens wafer and an imaging element wafer via a bonding section, and severing the resultant structure. Therefore, if there is an in-plane non-uniformity in the lens characteristic of the lens wafer, it is not possible to make adjustments for each imaging element chip, thus resulting in characteristic variations from one camera module to another. Moreover, the lens wafer needs to be molded, and the cost will be high though it is on the wafer level.

The pinhole cameras of Patent Document Nos. 3 and 4 do not need an image-capturing lens and are suitable for reducing the cost. However, when a pinhole camera is mounted, the imaging element chip and the pinhole can only be positioned with each other mechanically, and misalignment occurs if the parts precision decreases. In order to solve this problem, Patent Document No. 4 attempts to ensure the positional precision by bringing a portion of a part on which the pinhole is formed into direct contact with the end portion of the section of the imaging element chip, but this could cause the chip section to be chipped away and could lower the production yield.

With a pinhole camera as shown in FIG. 1(b) of Patent Document No. 4, in order to prevent dust from entering through the pinhole, there is a need to attach a glass to the area of the pinhole running through the light-blocking plate on the top surface, and a shock may break the edge of the glass and broken pieces may fall onto the photosensitive area of the imaging element, thereby deteriorating the image quality.

For pinhole cameras, the shape of the pinhole is dictated by the precision of the mold, and it is not possible to make a minute opening. When the size of the pinhole of a pinhole camera increases, the width of the optical path increases, and it is then difficult to obtain a high-resolution image.

Patent Document No. 3 proposes a system in which a wide-angle/telephoto selection is made on a pinhole camera by changing the distance from the photosensitive area of the imaging element chip to the pinhole, and in which there are provided modules different from each other in terms of the height of the wall of the package holding the pinhole so that the camera modules are switched around each time. In such a case, there is a need to provide molds for various package wall heights, thus requiring a cost for the molds, failing to realize a low cost.

With Patent Document No. 5, when an apodization filter is formed, it is necessary to improve the process precision, the assembly precision and the refractive index precision for the filter, thus resulting in a substantially high difficulty and a high cost.

Solution to Problem

In order to solve these problems set forth above, the present invention provides a solid-state imaging device, wherein: a plurality of photodiodes formed on each chip of a wafer and a cover glass being flat with no surface irregularities are attached together into an integral unit via an adhesive therebetween applied entirely or partially on an upper surface of each chip; the integral unit of the chip and the cover glass is cut along the same section into individual chips; a light-blocking layer is formed at least in an area on top of the cover glass, with one or more non light-blocking pinhole-shaped openings in a portion of the light-blocking layer; and the pinhole opening is formed while being aligned with an alignment mark on the chip.

Advantageous Effects of Invention

With the wafer-level pinhole camera module of the present invention, it is possible to provide inexpensive camera modules. That is, expensive lens wafers with lenses formed thereon are not used. The present invention can be realized by merely directly applying a light-blocking resin on an ordinary inexpensive cover glass being flat with no surface irregularities, covering the surface of imaging elements of a wafer-level camera module of the present invention, and then removing a portion of the light-blocking resin at a predetermined position in the imaging element area formed within the chip using a mask transfer technique used in ordinary IC production, so as to form a pinhole aperture. This gives an advantageous effect that the pinhole aperture allows an image of the subject to be formed on an imaging element area without using a lens, as a commonly-known pinhole camera, and by forming the pinhole by aligning the position thereof with an alignment mark that is provided on each chip, it is possible to form the pinhole with a precision as high as that of imaging element production. The alignment precision for conventional lens wafers with lenses formed thereon was only as good as the wafer-to-wafer alignment precision, thus only achieving a very low precision. This resulted in alignment precision variations between chips, thus deteriorating the optical characteristics.

An apodization filter can be formed with a high precision by patterning a light-blocking resin so that the light-blocking resin is tapered from the edge of the opening therein while ensuring alignment with an alignment mark provided on each chip. Therefore, the light-blocking rate can be varied with a high precision in the radial direction of the opening.

After the sensor chip wafer and the cover glass being flat with no surface irregularities are attached together, a light-blocking resin is formed on top of the cover glass. Then, a pinhole aperture is formed at a predetermined position through the light-blocking resin, and a hemispherical or Fresnel-shaped lens is formed therein. The lens can be formed with a high-precision alignment by forming the lens while being aligned with an alignment mark provided on each chip. Therefore, it is possible to significantly improve the deterioration of optical characteristics due to insufficient alignment precision of camera modules using conventional lens wafers.

BRIEF DESCRIPTION OF THE DRAWINGS

FIG. 1(A) FIG. 1(a) to FIG. 1(d) show the first half of a method for manufacturing a wafer-level pinhole camera module according to a first embodiment of the present invention.

FIG. 1(B) FIG. 1(e) to FIG. 1(g) show the second half of the method for manufacturing a wafer-level pinhole camera module according to the first embodiment of the present invention. FIG. 1(f') and FIG. 1(g') are perspective views of the camera module according to the first embodiment.

FIG. 2(A) FIG. 2(a) to FIG. 2(d) show the first half of a method for manufacturing a wafer-level pinhole camera module according to a second embodiment of the present invention.

FIG. 2(B) FIG. 2(e) to FIG. 2(h) show the second half of the method for manufacturing a wafer-level pinhole camera module according to the second embodiment of the present invention.

FIG. 2(C) FIG. 2(i) and FIG. 2(j) show the severing step and subsequent steps of the method for manufacturing a wafer-level pinhole camera module according to the second embodiment of the present invention. FIG. 2(j') is a perspective view of the camera module according to the second embodiment.

FIG. 3 is a diagram showing an optical path of light incident upon a camera module according to the first or second embodiment of the present invention.

FIG. 4 is a graph illustrating the angle of incidence and the amount of shift from the center of the photosensitive portion of the imaging element of a camera module according to an embodiment of the present invention.

FIG. 5 FIG. 5(a) and FIG. 5(b) show a method for manufacturing a wafer-level pinhole camera module according to a third embodiment of the present invention. FIG. 5(c) and FIG. 5(d) are perspective views of the camera module according to the third embodiment.

FIG. 6 FIG. 6(a) and FIG. 6(b) show a method for manufacturing a wafer-level pinhole camera module according to a fourth embodiment of the present invention. FIG. 6(c) and FIG. 6(d) are perspective views of the camera module according to the fourth embodiment.

FIG. 7 FIG. 7(a) and FIG. 7(b) show the cross-sectional shape of the pinhole portion and the transmitted light distribution according to the first to fourth embodiments of the present invention, and FIG. 7(c) and FIG. 7(d) show the cross sectional shape of the pinhole portion and the transmitted light distribution according to a fifth embodiment of the present invention.

FIG. 8 FIG. 8(a) to FIG. 8(d) show a method for manufacturing a pinhole portion of a wafer-level pinhole camera module according to the fifth embodiment of the present invention.

FIG. 9 FIG. 9(a) to FIG. 9(d) show a method for manufacturing a lens portion of a wafer-level pinhole camera module having a lens function according to a sixth embodiment of the present invention.

DESCRIPTION OF EMBODIMENTS

Structures of solid-state imaging devices (wafer-level pinhole camera modules) and methods for manufacturing the same according to embodiments of the present invention will now be described with reference to the drawings. In the following description, like members will be denoted by like reference numerals and process names, and will be described in detail for the first appearance thereof, while omitting redundant description of such like members.

Embodiment 1

A method for manufacturing a wafer-level pinhole camera module according to a first embodiment of the present invention will be described with reference to FIG. 1(a) to FIG. 1(f). FIG. 1(a) shows an image sensor wafer 1 formed on a semiconductor substrate, with a microlens 2 formed over pixels of a photosensitive portion of the surface of each sensor. In order to manufacture a wafer-level camera module, an adhesive material 3 is formed in areas other than the photosensitive portion of each sensor, and a cover glass wafer 4 is attached to the image sensor wafer 1 via the adhesive material 3 therebetween so as to cover the image sensor wafer 1.

As shown in FIG. 1(a), the microlens 2 is formed over pixels in the photosensitive portion on the surface of each sensor. The adhesive material 3 is formed in areas other than the photosensitive portion of each sensor, and the cover glass wafer 4 being flat with no surface irregularities, is attached thereto with the adhesive material 3 therebetween so as to cover the chips of the image sensor wafer 1. The gap portion above the microlens 2 up to the cover glass wafer 4 is normally hollow so as to realize a microlens effect. The infrared cut filter function and the anti-reflection film function may be added to the cover glass wafer 4.

Although not shown in the figures, the image sensor wafer 1 includes a through electrode as shown in Patent Document No. 1, and a wiring electrode pattern, which connects the electrode to be wired onto the wafer reverse surface via the through electrode, is already formed on the wafer reverse surface. In order to form the through electrode, the image sensor wafer 1 is thinned.

In the next step, as shown in FIG. 1(b), a light-blocking material 5 having a photosensitive function is applied on the cover glass wafer 4. A light-blocking material having a photosensitive function is, for example, a material such as a color resist including, dispersed therein, a pigment that includes a photosensitive group and has a light-blocking function, and is a material whose post-development remaining thickness varies depending on the amount of light exposure. The disclosure herein assumes and illustrates a positive-type material of which exposed portions are removed by the developer.

In the next step, as shown in FIG. 1(c), the light-blocking material 5 applied on the cover glass wafer 4 is selectively irradiated with light, and the exposed portions of the light-blocking material 5 are removed, thereby forming a pinhole opening (hereinafter "opening") 6. This step is performed in a similar step to the transfer exposure onto the resist on the wafer using a glass mask pattern, which is normally employed in a semiconductor manufacturing process, and the opening is formed with a good alignment precision by using an alignment mark on the surface of the image sensor chip (the total chip area including the dicing area). The wavelength of light used in the mask alignment may be in the wavelength range where light passes through the light-blocking material, and the visible range of the image sensor was excluded. Specifically, it may be ultraviolet light shorter than 400 nm and infrared light longer than 650 nm.

In the next step, as shown in FIG. 1(d), solder balls 7 are formed corresponding to the wiring electrode pattern formed on the reverse surface of the image sensor wafer 1. Thus, the sensor chip can be driven by applying a predetermined voltage or a clock pulse to the solder balls.

In the next step, as shown in FIG. 1(e), blade dicing is done along dicing areas (not shown) for severing the image sensor wafer 1 into individual pieces, whereby the image sensor wafer 1, the adhesive material 3, the cover glass wafer 4 and the light-blocking material 5 are severed along the same section into individual pieces.

In the description below, the image sensor wafer 1 and the cover glass wafer 4, after being severed into individual pieces, will be denoted with an apostrophe, i.e., an image sensor chip 1' and a cover glass 4', respectively, in order to distinguish between these members in an individual piece and these members in a wafer form. This similarly applies to an individual piece adhesive material 3' and an individual piece light-blocking material 5', but these members will be denoted as the adhesive material 3' and the light-blocking material 5', omitting the word "individual-piece". Those members that are individual pieces even in a wafer form, such as the microlens 2, the solder ball 7 and the opening 6, will not be denoted with an apostrophe.

The structure of a severed pinhole camera module is as shown in FIG. 1(f). The image sensor chip 1' with the microlens 2 formed thereon includes the solder balls 7 on the reverse surface thereof, and the severed cover glass 4' is attached to the surface thereof via the adhesive material 3' extending around the photosensitive portion. Moreover, the light-blocking material 5' is formed on the surface of the cover glass 4', with the opening 6 of the light-blocking material being located at the center of the photosensitive portion of the image sensor near the center of the light-blocking material 5'.

A perspective view of the pinhole camera module is as shown in FIG. 1(f'). The light-blocking material 5' is present on the top surface, with the opening 6 formed at the center thereof. The cover glass 4' is placed under the light-blocking material 5', and the image sensor chip 1' is placed under the cover glass 4' via an adhesive material (not shown). The solder balls 7 are present on the reverse surface.

Although the structure, as it is, has an imaging function as a camera module, if there is incident light coming sideway onto the severed surface of the cover glass 8', the light reaches, as stray light, the photosensitive portion of the image sensor chip 1', deteriorating the image quality.

In order to prevent the stray light, a severed, final-structure, pinhole camera module 9 is as shown in FIG. 1(g). A difference from FIG. 1(f) is that a side wall light-blocking coating 8 is applied over the side walls of the cover glass 4' and the image sensor chip 1'.

A perspective view of the pinhole camera module 9 is as shown in FIG. 1(g'). The light-blocking material 5' is present on the top surface (this should be referred to as the top surface light-blocking material 5', but it will be referred to as the light-blocking material 5'), with the opening 6 formed at the center thereof, and the side wall light-blocking coating 8 is applied to the camera module side wall portion below the light-blocking material 5'. Therefore, even if there is incident light from the side wall direction of the camera module, it is possible to prevent stray light from reaching the photosensitive portion of the image sensor chip 1'.

Embodiment 2

A method for manufacturing a wafer-level pinhole camera module according to a second embodiment of the present invention will be described with reference to FIG. 2(a) to FIG. 2(j). In FIG. 2(a), as in FIG. 1(a), the image sensor wafer 1 is formed on a semiconductor substrate, the microlens 2 is formed over pixels in the photosensitive portion on the surface of each sensor, the adhesive material 3 is formed in areas other than the photosensitive portion of each sensor, and the cover glass wafer 4 is attached to the image sensor wafer 1 via the adhesive material 3 so as to cover the image sensor wafer 1.

In the next step, as shown in FIG. 2(b), a dicing tape 10 is attached to the reverse surface of the image sensor wafer 1. The dicing tape 10 has an adhesive material (not shown) formed thereon for holding the wafer when the wafer is diced.

In the next step, as shown in FIG. 2(c), blade dicing is done along dicing areas (not shown) for severing the image sensor wafer 1 into individual pieces, whereby the image sensor wafer 1, the adhesive material 3 and the cover glass wafer 4 are severed. In this process, it is important to leave the dicing tape 10 unsevered. As shown in FIG. 2(c), a dicing groove 11 is formed in the gap portion between the severed cover glasses 4', the severed adhesive materials 3' and the severed image sensor chips 1'.

Next, as shown in FIG. 2(d), a light-blocking material 12 having a photosensitive function is applied to the top surface of the severed cover glasses 4', which are connected together by the dicing tape 10, and to the opposing walls of the dicing groove 11 in the gap portion between the cover glasses 4', the adhesive materials 3' and the image sensor chips 1'. As is the light-blocking material 5, the light-blocking material 12 having a photosensitive function is a material such as a color resist including, dispersed therein, a pigment that includes a photosensitive group and has a light-blocking function, and is a material that has such coverage that side walls of steps are covered. The light-blocking material 12 is applied so as to form a side wall portion light-blocking material 12' covering the walls of the dicing groove 11 and a bottom portion light-blocking material 12" covering the dicing groove bottom portion. The light-blocking material applied on the cover glass 4' should be referred to as the top surface portion light-blocking material 12, but it will be referred to as the light-blocking material 12 for the sake of simplicity.

In the next step, as shown in FIG. 2(e), the light-blocking material 12 applied on the cover glass 4' is selectively irradiated with light, and the exposed portions of the light-blocking material 12 are removed, thereby forming the opening G. This step is performed in a similar step to transfer exposure of a pattern onto a resist on a wafer, as shown in FIG. 1(c), and the opening is formed with a good alignment precision by using an alignment mark on the surface of the image sensor chip.

In FIG. 2(e), it is important that a wafer level process is performed on the cover glasses 4' and the image sensor chips 1', which have been diced into individual pieces but are connected together by the dicing tape 10 to be narrowly kept in a wafer form.

In the next step, as shown in FIG. 2(f), an expand tape 13 is attached onto the top surface of the cover glasses 4', which are narrowly kept in a wafer form by means of the dicing tape 10. The expand tape 13 may be a dicing tape material. The expand tape 13 has an adhesive material (not shown) formed thereon for holding together cover glass top surfaces.

The next step, as shown in FIG. 2(g), is a step of peeling the dicing tape 10 while the cover glasses 4' and the image sensor chips 1' are kept in a wafer form by means of the expand tape 13. The adhesion of the dicing tape 10 on the reverse surface of the image sensor chip 1' is decreased typically by lowering the adhesive strength through ultraviolet irradiation.

In the next step, as shown in FIG. 2(h), the solder balls 7 are formed so as to correspond to the wiring electrode pattern formed on the reverse surface of the image sensor chip 1' while the cover glasses 4' and the image sensor chips 1' are kept in a wafer form by means of the expand tape 13.

In the next step, as shown in FIG. 2(i), the expand tape 13 is literally expanded to increase the width of the dicing groove 11 in the gap portion between the cover glasses 4' and the image sensor chips 1', thereby severing the bottom portion light-blocking material 12" on the dicing groove bottom portion.

The structure of a severed pinhole camera module is as shown in FIG. 2(j). The solder balls 7 are present on the reverse surface of the image sensor chip 1' having the microlens 2 formed thereon, and the severed cover glass 4' is attached to the surface of the image sensor chip 1' via the adhesive material 3' extending around the photosensitive portion. Moreover, the light-blocking material 12 is formed on the surface of the cover glass 4', with the opening 6 of the light-blocking material being located at the center of the photosensitive portion of the image sensor near the center of the light-blocking material 12. The side wall portion light-blocking material 12' is present on the side wall portion of the cover glass 4' and the image sensor chip 1', and the severed piece of the bottom portion light-blocking material 12" is attached to the image sensor chip 1' bottom portion.

A perspective view of the pinhole camera module is as shown in FIG. 2(j). The light-blocking material 12 is present on the top surface, with the opening 6 formed at the center thereof, and the side wall portion light-blocking material 12' and the bottom portion light-blocking material 12" are formed on the camera module bottom portion and the side wall portion. Therefore, even if there is incident light from the side wall direction of the camera module, it is possible to prevent stray light from reaching the photosensitive portion of the image sensor chip 1'. The solder ball 7 is present on the image sensor chip 1' reverse surface.

<Verification for Practical Use>

Verification for practical use of the pinhole camera module shown in FIG. 1(g) and FIG. 2(j) is done as shown in FIG. 3 and FIG. 4.

FIG. 3 shows an optical path diagram of light incident upon a camera module according to the first and second embodiments. The angle of incidence of light incident upon the opening 6 of the pinhole camera module with respect to the direction normal to the module is denoted as θ. On the other hand, the angle of incidence into the cover glass 4' becomes θ' due to the influence of the refractive index, and the outgoing angle from the cover glass 4' into the hollow portion over the microlens returns to θ (not shown). The angle of incidence θ when the outgoing light is at the pixel edge is the maximum value of the angle of incidence.

FIG. 4 is a graph illustrating the angle of incidence (the horizontal axis in the figure) and the amount of shift (the vertical axis in the figure) from the center of the photosensitive portion of the imaging element of the camera module according to the first and second embodiments. The thickness of the cover glass is assumed to be 700 um, and three different cases where the adhesive material thickness (referred to in the figure as "GAP BETWEEN COVER GLASS REVERSE SURFACE AND IMAGE-FORMING SURFACE") is 0 um, 25 um and 50 um are plotted on the graph.

The broken lines in FIG. 4 represent the relationship between the position of the edge pixel with respect to the center (the amount of shift from the center) and the maximum value of the angle of incidence θ for three different VGA (640×480 pixels) image sensors whose pixel sizes are 1.4 um, 1.75 um and 2.2 um. The maximum value of the angle of incidence is an angle of view equivalent to that of a camera module using a lens for normal to wide angle applications.

Embodiment 3

A wafer-level pinhole camera module according to a third embodiment of the present invention will now be described with reference to FIG. 5(a) to FIG. 5(d). The third embodiment is a wafer-level pinhole camera suitable for stereoscopic camera applications.

FIG. 5(a), as is FIG. 2(i), is a cross sectional structure diagram after the expand tape 13 is literally expanded to increase the width of the dicing groove 11 in the gap portion between the cover glasses 4' and the image sensor chips 1', thereby severing the bottom portion light-blocking material 12" on the dicing groove bottom portion. A difference from FIG. 2(i') is that the severing is done as if two adjacent image sensor chips were a single image sensor chip.

The structure of the severed pinhole camera module is as shown in FIG. 5(b). The light-blocking material 12 is present on the top surface, and two openings 6 are formed in the light-blocking material 12 with an interval therebetween that is generally equivalent to the size of an image sensor chip. The openings corresponding to the two image sensor chips 1' are denoted as 6L and 6R, respectively. They correspond to right-eye and left-eye camera lenses of a stereoscopic camera. Distance measurement is done based on the misalignment between positions of incident light from the same spot on the subject on the image-forming surfaces of the two image sensor chips. The interval is expressed above as being generally equivalent to the size of an image sensor chip because the position of the opening slightly shifts from the center of the photosensitive area of the corresponding image sensor, depending on the position of the subject that is being mainly observed.

A perspective view of the pinhole camera module shown in FIG. 5(b) is as shown in FIG. 5(c). The light-blocking material 12 is present on the top surface, and the openings 6L and 6R are formed in the light-blocking material 12. The side wall portion light-blocking material 12' and the bottom portion light-blocking material 12" are formed on the camera module side wall portion and the bottom portion. Therefore, even if there is incident light from the side wall direction of the camera module, it is possible to prevent stray light from reaching the photosensitive portion of the image sensor chip. The solder balls 7 are present on the image sensor chip reverse surface.

FIG. 5(d) shows a perspective view of a pinhole camera module with four openings. Four image sensor chips are arranged corresponding respectively to the four openings. The application of this camera module is in the field of multi-eye cameras, and this camera module is used in a camera system that obtains distance information from captured view images of the same subject for different incident directions.

With conventional multi-eye cameras, distance information is calculated based on view images for different incident directions, and therefore the precision of the interval between images on the substrate is important. The precision of the interval between images is influenced by the camera mounting precision, the lens assembly precision and the image sensor mounting precision, and there is a need to improve these mounting precisions, requiring a high-precision mounting apparatus. Even then, in total, a precision of only some tens of um can be realized.

According to the third embodiment of the present invention, the interval between image sensor chips and the position of the opening corresponding to the lens are dictated by the mask production precision and the mask alignment precision, and a precision of 1 um or less can be achieved, which is a significant improvement in precision from the conventional art.

For example, with the conventional systems, there may be variations by tens of pixels for the pixel size of 1.1 um, which is the size of current mainstream minute pixels. According to the present invention, on the other hand, positioning can be done at the center position of the unit pixel area of a 1.1-um pixel, with a high mask alignment precision of about 0.1 um.

Embodiment 4

A wafer-level pinhole camera module according to a fourth embodiment of the present invention will be described with reference to FIG. 6(a) to FIG. 6(d). The fourth embodiment, as is the third embodiment, is a wafer-level pinhole camera suitable for stereoscopic camera applications.

FIG. 6(a), as is FIG. 5(a), is a cross-sectional structure diagram after the expand tape 13 is literally expanded to increase the width of the dicing groove 11 in the gap portion between the cover glasses 4' and the image sensor chips 1', thereby severing the bottom portion light-blocking material 12" on the dicing groove bottom portion. A difference from FIG. 5(a) is that two openings are formed in one image sensor chip, and the severing is done so that each piece includes one image sensor chip.

The structure of a severed pinhole camera module is as shown in FIG. 6(b). The light-blocking material 12 is present on the top surface of the single image sensor chip 1', and two openings 6L and 6R are formed in the light-blocking material 12. They also correspond to right-eye and left-eye camera lenses of a stereoscopic camera. Distance measurement is done based on the misalignment between two positions of incident light from the same spot on the subject on the image forming surface of the single image sensor chip.

A perspective view of the pinhole camera module shown in FIG. 6(b) is as shown in FIG. 6(c). The light-blocking material 12 is present on the top surface, and two openings are formed in the light-blocking material 12. A light-blocking material is formed on the camera module side wall portion, preventing incident light coming from the side wall direction of the camera module from reaching the photosensitive portion of the image sensor chip. Solder balls are present on the image sensor chip reverse surface.

FIG. 6(d) shows a perspective view of a pinhole camera module with four openings. The four openings correspond to one image sensor chip. The application of this camera module is also in the field of multi-eye cameras as that of FIG. 5(d), and this camera is used in a camera system that obtains distance information from captured view images of the same subject for different incident directions.

Embodiment 5

The shape of and around the opening of a wafer-level pinhole camera module according to an embodiment of the present invention and the transmitted light intensity distribution will be described with reference to FIG. 7(a) to FIG. 7(d). FIG. 7(c) and FIG. 7(d) show a wafer-level pinhole camera corresponding to a fifth embodiment.

FIG. 7(a) shows the shape of the opening 6 formed in the light-blocking material 5 according to the first to fourth embodiments. The light-blocking material wall surface portion of the opening 6 is vertical.

FIG. 7(b) shows the intensity distribution of the transmitted light shown in FIG. 7(a). The intensity distribution of the transmitted light is step shaped, corresponding to the shape of the opening. In the figure, the vertical axis is the transmitted light intensity, and the horizontal axis is the position information around the opening.

FIG. 7(c) shows the shape of the opening 6 formed in the light-blocking material 5 of the wafer-level pinhole camera module according to the fifth embodiment of the present invention. The light-blocking material wall surface portion of a tapered opening 6' is tapered and sloped.

FIG. 7(d) shows the intensity distribution of the transmitted light shown in FIG. 7(c). The intensity distribution of the transmitted light is tapered, corresponding to the shape of the opening. In the figure, the vertical axis is the transmitted light intensity, and the horizontal axis is the position information around the opening. Now, the material of the light-blocking material 5 is selected so that the transmittance changes with the thickness and that an intensity distribution as shown in FIG. 7(d) can be realized.

With the transmitted light intensity distribution as shown in FIG. 7(d), it is similar to an apodization filter, and it is possible to improve the false resolution. The apodization filter can be formed on the cover glass, and the alignment can be done on the wafer level, enabling easy production.

A method for manufacturing the shape of and around the opening of the wafer-level pinhole camera module according to the fifth embodiment of the present invention shown in FIG. 7(c) will be described with reference to FIG. 8(a) to FIG. 8(d).

As shown in FIG. 8(a), the light-blocking material 5 is applied on the cover glass wafer 4, and a positive-type photosensitive material 14 is further applied thereon. A positive-type photosensitive material is a resist material such that exposed portions are removed by a developer, and is a material having such a characteristic that the post-development remaining thickness varies depending on the amount of light exposure.

In the next step, as shown in FIG. 8(b), the photosensitive material 14 is selectively irradiated with light. In this process, it is important to form an exposed area 14' such that the amount of light exposure is varied across the photosensitive material 14, corresponding to the tapered shape of the opening. In order to achieve this, the shade of a glass mask used in a semiconductor manufacturing process is varied so that the transmittance is varied at the edge of the opening pattern of the mask, thereby varying the amount of light exposure to be transmitted.

In the next step, as shown in FIG. 8(c), the exposed photosensitive material 14', across which the amount of light exposure is varied, is removed in a development step. The remaining thickness of the photosensitive material varies depending on the amount of light exposure, resulting in a photosensitive material shape 14" having a tapered opening pattern.

In the next step, as shown in FIG. 8(d), the tapered photosensitive material 14" having the tapered opening pattern and the light-blocking material 5 are etched away at the same time. In this process, the etching rate for the photosensitive material and that for the light-blocking material are kept generally equal to each other so that it is possible to transfer the tapered photosensitive material 14" onto the light-blocking material 5 as the tapered opening 6' while maintaining the similarity in shape.

In an alternative embodiment, as shown in FIG. 1(c), the light-blocking material 5 having a light-blocking function is used, and the shade of a glass mask is varied so that the transmittance is varied at the edge of the opening pattern of the mask, thereby varying the amount of light exposure to be transmitted. Thus, the amount of light exposure is varied in a tapered pattern across the light-blocking material 5 around the opening. Then, the light-blocking material after development can be shaped into the light-blocking material shape 5 having the tapered opening 6' as shown in FIG. 8(d).

A method for manufacturing a structure in which a lens shape is formed in the opening of a wafer-level pinhole camera module according to an embodiment of the present invention will be described with reference to FIG. 9(a) to FIG. 9(c). FIG. 9(a) corresponds to the fifth embodiment of FIG. 7(c), showing a structure in which the light-blocking material 5 is applied on the cover glass wafer 4 being flat with no surface irregularities, and the positive-type photosensitive material 14 is further applied thereon.

In the next step, the photosensitive material 14 corresponding to the position of the opening is selectively irradiated with light. The photosensitive material 14 can be irradiated with light having an amount of light exposure intensity distribution corresponding to a lens shape so that the photosensitive material 14 after development is shaped into a lens shaped photosensitive material 14''' in the opening as shown in FIG. 9(b).

In order to achieve this, the shade of a glass mask used in a semiconductor manufacturing process is varied so that the transmittance is varied at the edge of the opening pattern of the mask, thereby varying the amount of light exposure to be transmitted, as shown in FIG. 9(b), and the exposed area, across which the amount of light exposure is varied, can be removed in a development step, thus obtaining the lens-shaped photosensitive material 14''', as shown in FIG. 8(c).

In the next step, as shown in FIG. 8(c), the lens-shaped photosensitive material 14''' and the cover glass material 4 are etched away at the same time. In this process, the etching rate for the photosensitive material and that for the cover glass material are kept generally equal to each other so that it is possible to transfer the lens-shaped photosensitive material 14''' onto the cover glass 4 as the lens-shaped cover glass 4".

Regarding the lens shape of the opening transferred onto the cover glass 4, it can be transferred into a Fresnel lens shaped cover glass 4''' as shown in FIG. 9(d).

Embodiment 6

A microlens is formed over pixels in the photosensitive portion in Embodiments 1 to 4 described above, but the microlens may be absent, and there is a hollow portion over the microlens, but the hollow portion may be filled with a material having a refractive index lower than that of the material of the microlens. Moreover, an adhesive material on the image sensor is formed in areas other than the photosensitive portion, but an adhesive material may be applied across the entire surface of the image sensor as long as transparency can be reserved.

The light-blocking material is shown in Embodiments 1 to 4 described above to be covering the cover glass top surface, the cover glass side wall portion, the adhesive material side wall portion and the image sensor side wall portion, but the light-blocking material may cover only predetermined areas such that the light-blocking property of the cover glass top surface can be ensured, as long as light leakage from the side wall is not problematic in practical use.

The cross-sectional shape of the opening in the light-blocking material is shown in Embodiment 5 described above to be tapered, but the cross sectional shape may be vertical as shown in FIG. 7(a).

The lens shape in the opening is formed by etching the cover glass as shown in FIG. 9(c) and FIG. 9(d) in Embodiment 5 described above, but it may be realized by forming, on the cover glass, a transparent material in a lens shape as shown in the opening of FIG. 9(b).

A light-blocking material is formed on the cover glass wafer and aligned with the alignment mark on the surface of the image sensor chip to form the opening in Embodiment 1 and Embodiment 2 described above. If the alignment mark on the surface of the image sensor chip cannot be detected due to the light-blocking material, the light-blocking material over the alignment mark may be partially removed by a width that is dictated by the mechanical precision, so as to detect the position of the alignment mark through the portion where the light-blocking material is removed, and the light-blocking material may be removed precisely in the area corresponding to the pinhole opening, thus forming the opening. The removed portion of the light-blocking material over the alignment mark may be coated, as necessary, with a light-blocking coating for blocking light.

Another possible method is that a step is formed in advance partially on the cover glass wafer surface, and the image sensor wafer is attached thereto by aligning the step with the alignment marker of the image sensor wafer, wherein the position at which the pinhole opening is formed is determined by detecting a step when applying the light-blocking material.

A wiring electrode pattern is formed on the image sensor wafer reverse surface via a through electrode, with solder balls formed thereon, in Embodiments 1 to 4 described above, but there is no need for the solder balls if there is a way to make an electrical connection between the substrate on which the solid state imaging device is mounted and the reverse surface wiring pattern without using solder balls (e.g., socket mounting or mounting via conductive paste).

Since the wiring electrode pattern is formed on the image sensor wafer reverse surface via the through electrode, with solder balls formed thereon, an expand tape is attached on the surface, in Embodiments 2 to 4 described above, but if the solder balls absent, the image sensor wafer can be divided into individual pieces by stretching the dicing tape without using the expand tape applied thereon.

INDUSTRIAL APPLICABILITY

As described above, with a wafer-level pinhole camera module according to the present invention, the light-blocking process on the side surfaces can be done at once on the wafer level, in addition to being able to easily and precisely form pinholes at once in a wafer form, without the need to form pinholes individually as with ordinary pinhole camera modules. With a camera module of the present configuration, there is no lens mounting step, and there is no need for a lens focusing mechanism.

The opening portion of the pinhole may be machined into a lens shape. It becomes similar to an apodization filter if the light-blocking property is gradually varied around the opening of the pinhole, thus improving the false resolution. The apodization filter can be formed on the cover glass, and the alignment can be done on the wafer level, enabling easy production. By handing everything on the wafer level, it is possible to provide very inexpensive camera modules.

REFERENCE SIGNS LIST

1 Image sensor wafer
1' Image sensor chip
2 Microlens
3 Adhesive material
3' Individual piece adhesive material
4 Cover glass wafer
4' Cover glass
4" Lens shaped cover glass
4''' Fresnel lens shaped cover glass
5 Light-blocking material
5' Individual piece top surface light-blocking material
6 (Pinhole) opening
6L, 6R Opening
6' Tapered opening
7 Solder ball
8 Side wall light-blocking coating
9 Pinhole camera module
10 Dicing tape
11 Dicing groove
12 (Top surface portion) light-blocking material
12' Side wall portion light-blocking material
12" Bottom portion light-blocking material
13 Expand tape
14 Photosensitive material
14' Exposed photosensitive material
14" Tapered photosensitive material
14''' Lens-shaped photosensitive material

The invention claimed is:
1. A solid-state imaging device, comprising
an image sensor chip including a plurality of photodiodes;
a cover glass being flat with no surface irregularities;
an individual-piece adhesive material applied entirely or partially between the image sensor chip and the cover glass; and
a light-blocking layer on a surface of the cover glass opposite to a surface thereof with the individual-piece adhesive material, the light-blocking layer having one or more non-light-blocking pinhole-shaped openings;
wherein the image sensor chip and cover glass are attached together into an integral unit via the individual-piece adhesive material.

2. The solid-state imaging device according to claim 1, wherein a side surface of the cover glass has a light-blocking layer thereon.

3. The solid-state imaging device according to claim 1, wherein the pinhole opening has a tapered shape such that a thickness of the light-blocking layer decreases toward the opening.

4. A solid-state imaging device, comprising:
an image sensor chip including a plurality of photodiodes;
a cover glass being flat with no surface irregularities;
an individual-piece adhesive material applied entirely or partially between the image sensor chip and the cover glass; and
a light-blocking layer on a surface of the cover glass opposite to a surface thereof with the individual-piece adhesive material, the light-blocking layer having one or more non-light-blocking pinhole-shaped openings;
a hemispherical or Fresnel lens on the cover glass within the opening, wherein the image sensor chip and cover glass are attached together into an integral unit via the individual-piece adhesive material; and the hemispherical or Fresnel lens is made of a transparent material.

5. A solid-state imaging device, comprising:

an image sensor chip including a plurality of photodiodes;

a cover glass with one or more hemispherical or Fresnel lenses; and an individual-piece adhesive material applied entirely or partially between the image sensor chip and the cover glass; and a light-blocking layer on a surface of the cover glass opposite to a surface thereof with the individual-piece adhesive material, the light-blocking layer having one or more non-light-blocking pinhole-shaped openings;

wherein the image sensor chip and cover glass are attached together into an integral unit via the individual-piece adhesive material; and the hemispherical or Fresnel lens is within the opening.

* * * * *